(12) United States Patent
Miyazaki (10) Patent No.: US 8,405,818 B2
(45) Date of Patent: Mar. 26, 2013

(54) POSITION DETECTION APPARATUS, EXPOSURE APPARATUS, AND DEVICE FABRICATION METHOD

(75) Inventor: Tadaki Miyazaki, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 310 days.

(21) Appl. No.: 12/861,282

(22) Filed: Aug. 23, 2010

(65) Prior Publication Data
US 2011/0051111 A1    Mar. 3, 2011

(30) Foreign Application Priority Data
Aug. 27, 2009  (JP) ................... 2009-197236

(51) Int. Cl.
*G03B 27/42* (2006.01)
*G03B 27/52* (2006.01)

(52) U.S. Cl. ........................... 355/53; 355/55

(58) Field of Classification Search ............ 355/53, 355/55, 67; 356/399–401
See application file for complete search history.

(56) References Cited

U.S. PATENT DOCUMENTS

| 5,986,766 A | 11/1999 | Koga et al. | |
|---|---|---|---|
| 7,229,566 B2* | 6/2007 | Matsumoto et al. | 216/60 |
| 7,714,982 B2* | 5/2010 | Nagasaka | 355/53 |

FOREIGN PATENT DOCUMENTS

JP      09-218714 A    8/1997

* cited by examiner

*Primary Examiner* — Hung Henry Nguyen
(74) *Attorney, Agent, or Firm* — Rossi, Kimms & McDowell LLP (57) ABSTRACT

The present invention provides a position detection apparatus including a sensor in which a plurality of regions where light from a mark formed on a substrate held by a stage is detected are arrayed in a first direction, a driving unit configured to drive the stage, a control unit configured to control the driving unit so as to drive the stage in a second direction perpendicular to a height direction of the substrate, so that the light guided from the mark to the sensor enters the plurality of regions while moving in the first direction, and to drive the stage in the height direction of the substrate, and a processing unit configured to process the signals from the sensor, wherein the processing unit determines a position of the substrate in the height direction, which exhibits a peak in a light intensity distribution in the first direction generated by the signals.

6 Claims, 7 Drawing Sheets

POSITION DETECTION APPARATUS, EXPOSURE APPARATUS, AND DEVICE FABRICATION METHOD

BACKGROUND OF THE INVENTION

1. Field of the Invention

The present invention relates to a position detection apparatus, an exposure apparatus, and a device fabrication method.

2. Description of the Related Art

A demand has arisen for an exposure apparatus with higher precision and higher functionality. For example, a technique for matching the pattern of a reticle (mask) with a wafer (a pattern formed on it) on the order of nanometers has been demanded in alignment between a reticle and a wafer.

One method of the alignment between a reticle and a wafer is wafer alignment. In the wafer alignment, first, a wafer is loaded into a system including an exposure apparatus and mechanical alignment apparatus. The mechanical alignment apparatus then coarsely aligns the wafer using an orientation flat or notch formed on the periphery of the wafer. The coarsely aligned wafer is placed on a wafer stage of the exposure apparatus by a wafer loader. Note that the mechanical alignment apparatus generally has an alignment accuracy of about 20 μm.

Next, global alignment in which the positions of a plurality of alignment marks formed on the wafer are calculated is performed (see Japanese Patent Laid-Open No. 09-218714). The global alignment serves to align the wafer in accordance with the same correction equation over its entire region. Hence, the alignment state can be examined by observing (detecting) some of the plurality of alignment marks. Note that the global alignment accuracy is 10 nm or less.

In the global alignment, the alignment marks are observed using, for example, two sensors: a low-magnification sensor serving as an area sensor, and a high-magnification sensor serving as a line sensor. The final positions of the alignment marks are determined based on their images sensed by the high-magnification sensor. However, the high-magnification sensor has so narrow an observation field of view that the alignment marks often fall outside the observation field of view. To combat this situation, two low-magnification observation marks formed at left and right positions, respectively, on the wafer are observed using the low-magnification sensor to calculate and correct shifts in the X- and Y-axis directions, rotational components, and shot magnification components of the wafer so that the alignment marks fall within the observation field of view of the high-magnification sensor. Note that alignment using a low-magnification sensor is called search alignment, and that using a high-magnification sensor is called fine alignment.

In the fine alignment, focus adjustment needs to be performed so that the alignment marks each are positioned at a best focus position of the high-magnification sensor in order to detect the alignment marks with high accuracy. In the focusing, images of the alignment marks are sensed while driving (scanning) the wafer stage in the Z-axis direction, and the contrasts of the images of the alignment marks sensed at each Z position are calculated. A Z position where the contrast maximizes is determined as a best focus position.

In exposing each shot on the wafer, the wafer stage is scanned based on the global alignment result, and the pattern formed within the shot is precisely aligned with the pattern of the reticle projected onto the wafer via a projection optical system.

In this manner, in the wafer alignment, the alignment marks are observed by switching a plurality of sensors such as a low-magnification sensor and a high-magnification sensor. Also, a method of observing the alignment marks using one high-resolution sensor in place of a plurality of sensors has recently been proposed. A high-resolution sensor can not only obtain a field of view corresponding to that of a low-magnification sensor using a wide field of view, but also obtain a resolution corresponding to that of a high-magnification sensor. This makes it possible to observe the low-magnification observation marks and the alignment marks using only one sensor.

Unfortunately, since a high-resolution sensor includes a large number of pixels, it takes a long time for this sensor to transfer signals (that is, it takes much time for this sensor to read signals from the large number of pixels, respectively). As a result, it takes much time to sense images of the alignment marks at each Z position in the focusing. This makes it impossible to perform wafer alignment (fine alignment) in a short period of time.

SUMMARY OF THE INVENTION

The present invention provides a technique which can align a substrate in a short period of time.

According to one aspect of the present invention, there is provided a position detection apparatus including a sensor in which a plurality of regions where light from a mark formed on a substrate held by a stage is detected are arrayed in a first direction, a first driving unit configured to drive the stage, a control unit configured to control the first driving unit so as to drive the stage in a second direction perpendicular to a height direction of the substrate, so that the light guided from the mark to the sensor enters the plurality of regions while moving in the first direction, and to drive the stage in the height direction of the substrate, and a processing unit configured to process the signals from the sensor, wherein the processing unit determines a position of the substrate in the height direction, which exhibits a peak in a light intensity distribution in the first direction generated by the signals.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
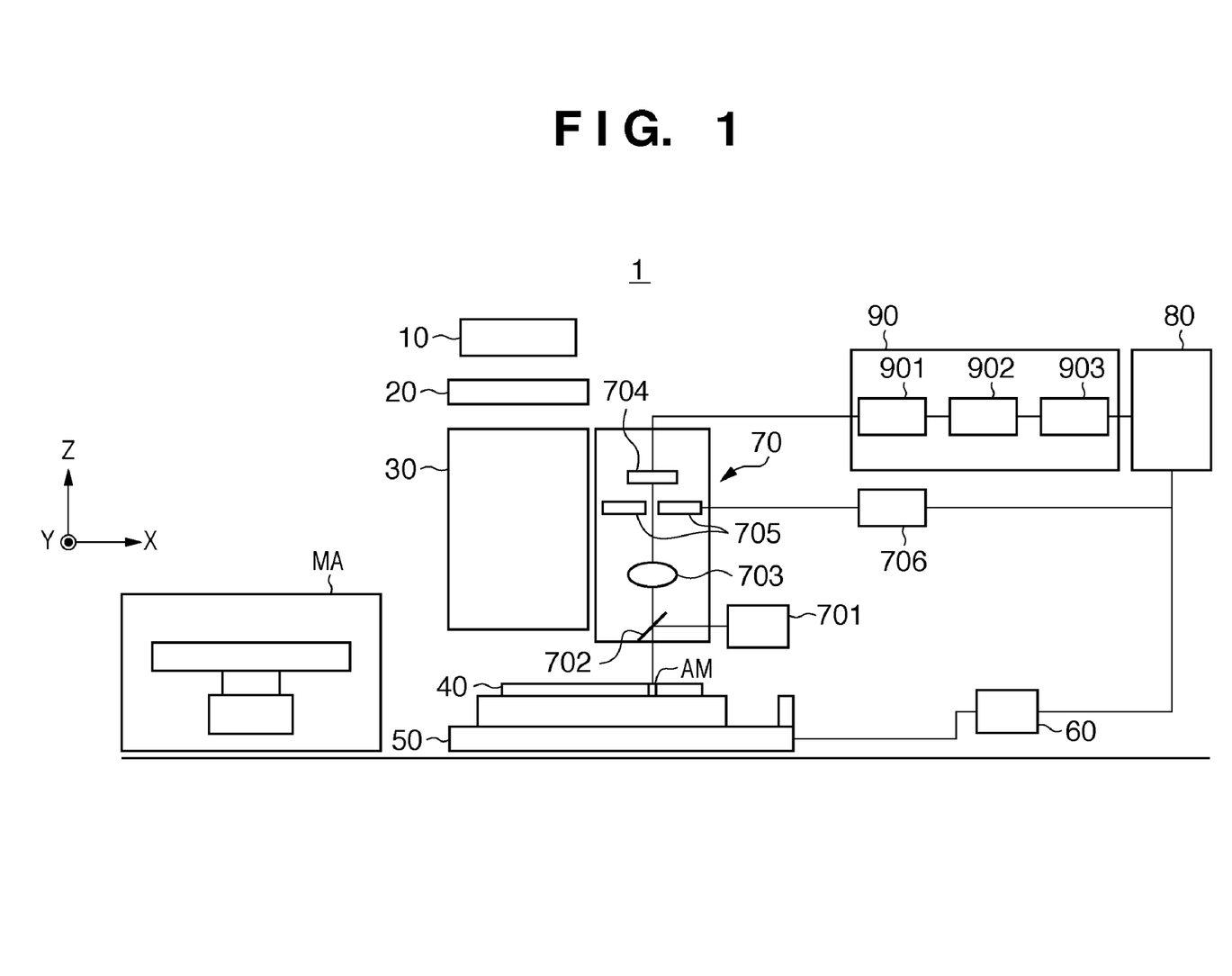
FIG. 1 is a schematic block diagram showing the arrangement of an exposure apparatus according to one aspect of the present invention.

FIG. 1 is a schematic block diagram showing the arrangement of an exposure apparatus 1 according to one aspect of the present invention. In this embodiment, the exposure apparatus 1 forms a lithography system in cooperation with a mechanical alignment apparatus MA, and transfers the pattern of a reticle 20 onto a wafer 40 using the step & scan scheme. However, the exposure apparatus 1 can also adopt the step & repeat scheme or another exposure scheme.

The exposure apparatus 1 includes an illumination optical system 10, a reticle stage (not shown) which holds the reticle 20, a projection optical system 30, a wafer stage 50 which holds the wafer 40, a first driving unit 60, an alignment detection system 70, a control unit 80, and a processing unit 90.

The illumination optical system 10 illuminates the reticle 20 on which a pattern (circuit pattern) is formed with light from a light source such as a KrF excimer laser with a wavelength of about 248 nm, an ArF excimer laser with a wavelength of about 193 nm, or an $F_2$ laser with a wavelength of about 157 nm.

The reticle 20 has a pattern to be transferred onto the wafer 40, and is held and driven by the reticle stage (not shown). The reticle stage drives the reticle 20 using, for example, a linear motor. The light diffracted by the pattern of the reticle 20 is projected onto the wafer 40 via the projection optical system 30.

The projection optical system 30 includes a plurality of optical elements, and projects the pattern of the reticle 20 onto the wafer 40. The projection optical system 30 can be a dioptric system, a catadioptric system, or a catoptric system.

The wafer 40 is a substrate onto which the pattern of the reticle 20 is projected (transferred), and is held and driven by the wafer stage 50. However, the wafer 40 can also be substituted by a glass plate or another substrate. The wafer stage 50 drives the wafer 40 upon being driven by the first driving unit 60 such as a linear motor or an actuator.

The alignment detection system 70 is a position detection apparatus which detects the position of the wafer 40 by observing (detecting) an alignment mark AM formed on the wafer 40. In this embodiment, the alignment detection system 70 includes an illumination light source 701, half mirror 702, imaging optical system 703, sensor 704, light shielding plate 705, and second driving unit 706. The half mirror 702 can also be substituted by a polarizing beam splitter.

Light from the illumination light source 701 illuminates the alignment mark AM, formed on the wafer 40, via the half mirror 702. The light reflected by the alignment mark AM enters the sensor 704 upon passing through the half mirror 702 and imaging optical system 703.

The sensor 704 has a plurality of regions which are arrayed in the X-axis direction (first direction) and where the light from the alignment mark AM is detected. Each of the plurality of regions includes pixels two-dimensionally arrayed in the X-axis direction and the Y-axis direction (a third direction perpendicular to the first direction). In this manner, the sensor 704 serves as a high-resolution sensor. The sensor 704 stores charges corresponding to light beams guided to the plurality of regions, respectively, and outputs signals indicating the stored charges to the processing unit 90.

The light shielding plate 705 is arranged between the wafer 40 and the sensor 704 and, more specifically, placed immediately upstream of the sensor 704, and has an aperture (slit) to guide the light from the alignment mark AM to arbitrary regions (that is, some of the plurality of regions) on the sensor 704. The light shielding plate 705 is driven in the X-axis direction by the second driving unit 706 such as a linear motor or an actuator. The light from the alignment mark AM can be selectively guided to only arbitrary regions on the sensor 704 by changing the position of the light shielding plate 705 in the X-axis direction.

The control unit 80 controls the overall operation of the exposure apparatus 1. In this embodiment, the control unit 80 controls operations (processes) associated with alignment of the wafer 40. For example, the control unit 80 controls the first driving unit 60 so as to drive the wafer stage 50 in the height direction (Z-axis direction) of the wafer 40 so that the light guided from the alignment mark AM to the sensor 704 sequentially enters the plurality of regions on the sensor 704 while moving in the X-axis direction. At this time, the control unit 80 controls the first driving unit 60 so as to drive the wafer stage 50 in the X-axis direction (second direction) perpendicular to the height direction of the wafer 40.

The processing unit 90 has a function of processing signals (image signals) output from the sensor 704 of the alignment detection system 70, and includes, for example, an A/D converter 901, memory 902, and CPU 903. The A/D converter 901 converts analog signals from the sensor 704 into digital signals. The memory 902 stores the digital signals converted by the A/D converter 901 as image data. The CPU 903 processes the image data stored in the memory 902, and calculates the image contrast and the position of the alignment mark AM.

Alignment (wafer alignment) of the wafer 40 in the exposure apparatus 1 will be explained herein. First, the wafer 40 is loaded into the mechanical alignment apparatus MA via a wafer transport mechanism (not shown). The mechanical alignment apparatus MA coarsely aligns the wafer 40 (that is, determines the rough position of the wafer 40) based on an orientation flat or notch formed on the periphery of the wafer 40.

The coarsely aligned wafer 40 is placed on the wafer stage 50 via a wafer loader (not shown). Global alignment is then performed by adjusting the focus (the position of the wafer 40 in the height direction) between the alignment detection system 70 (sensor 704) and the alignment mark AM formed on the wafer 40. The position of the wafer 40 and the positions of a plurality of shots on the wafer 40 can be precisely obtained by the global alignment.

Figure 2A:
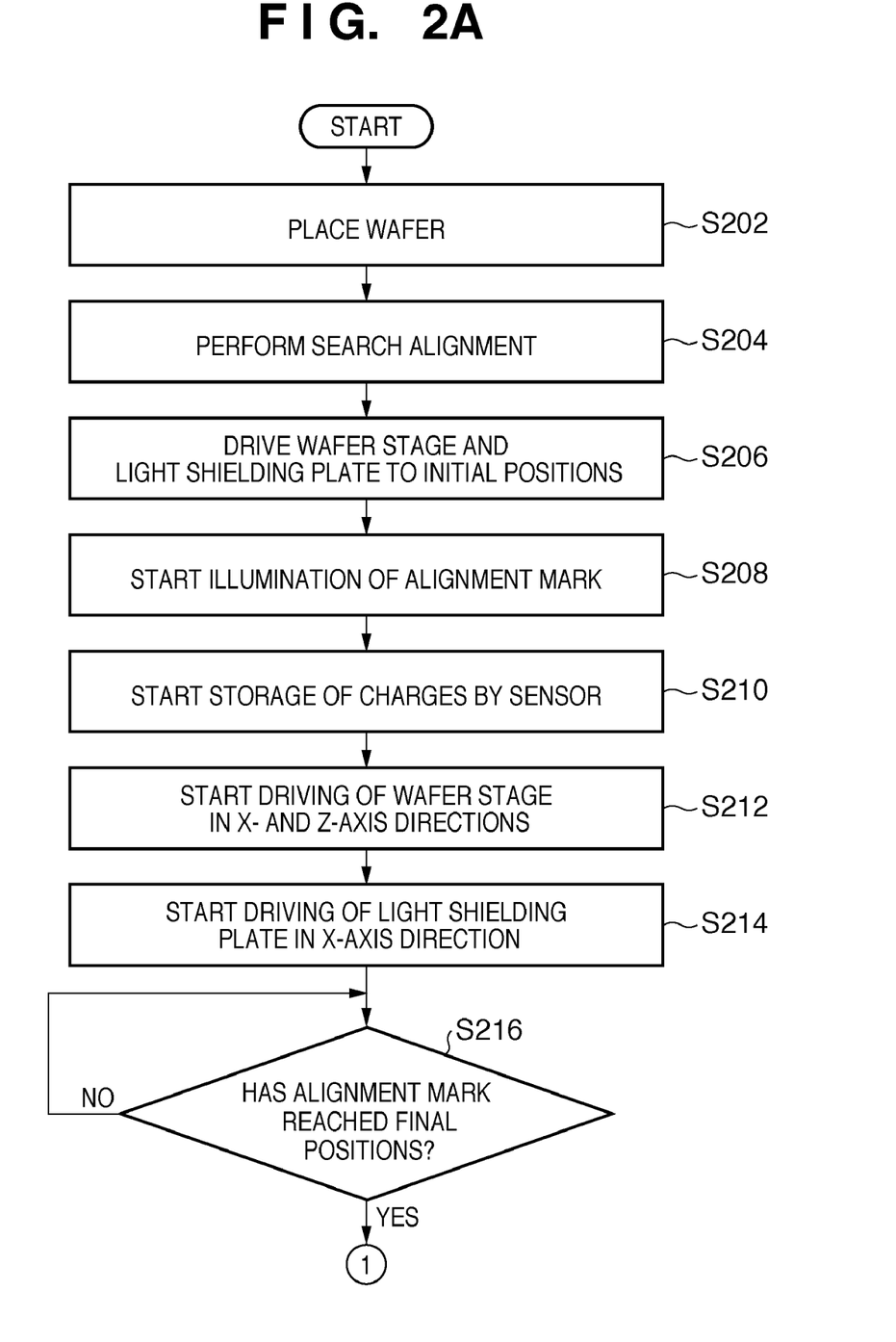
FIGS. 2A and 2B are flowcharts for explaining wafer alignment in the exposure apparatus shown in FIG. 1.
Figure 2B:
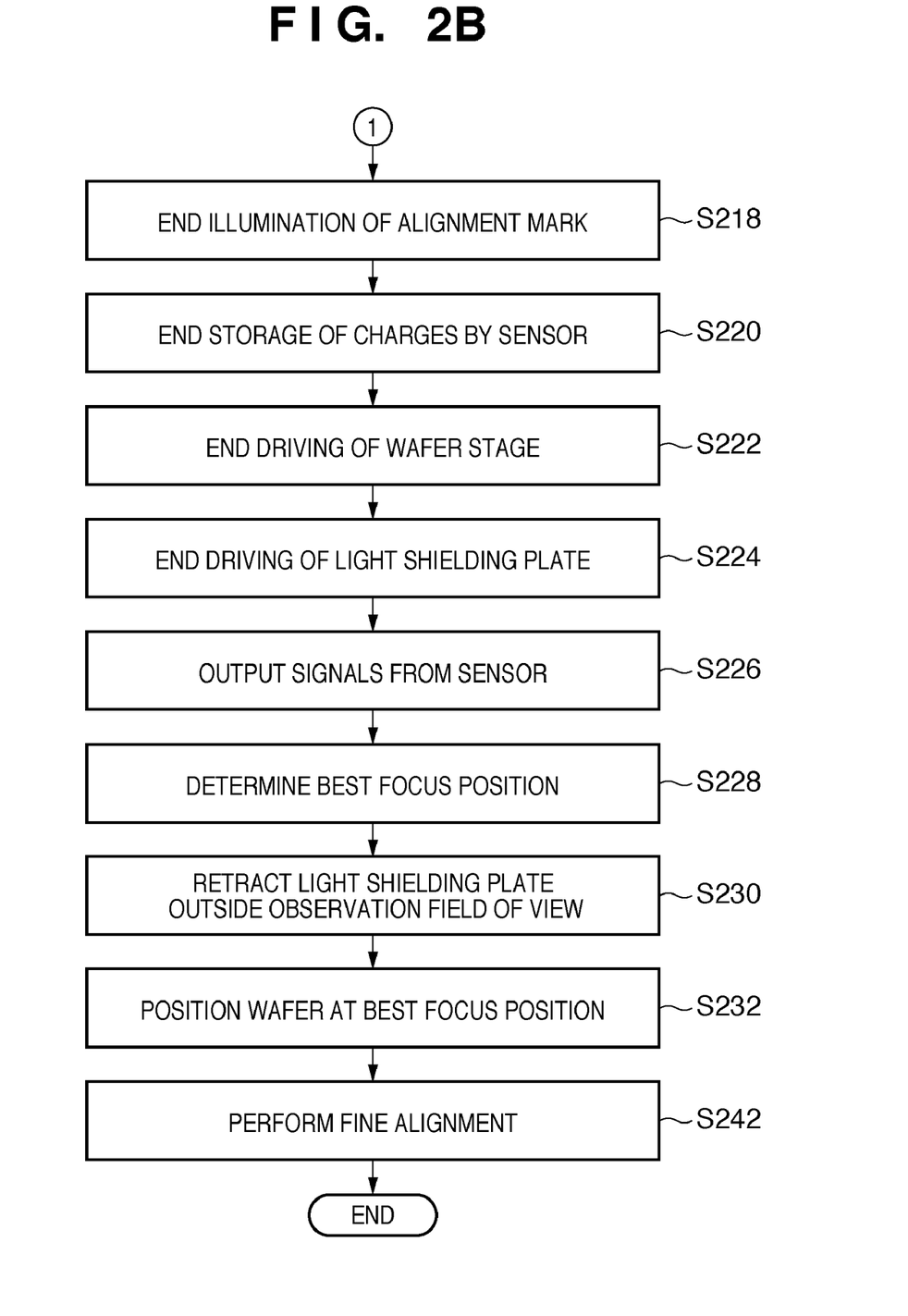

The wafer alignment in the exposure apparatus 1 will be explained in more detail below with reference to FIGS. 2A and 2B. The wafer alignment is performed by systematically controlling each unit of the exposure apparatus 1 by the control unit 80.

In step S202, the wafer 40 is placed on the wafer stage 50 via the mechanical alignment apparatus MA. In step S204, search alignment is performed by observing (detecting) search alignment marks (not shown), formed at left and right positions on the wafer 40, using the alignment detection system 70. In the search alignment, to set a wide observation field of view, the search alignment marks are detected by setting a wide range in which signals are read from the sensor 704. Since shifts in the X- and Y-axis directions, rotational components, and shot magnification components of the wafer 40 can be calculated and corrected by the search alignment, the alignment mark AM can be brought into the observation field of view in fine alignment.

Figure 3A:
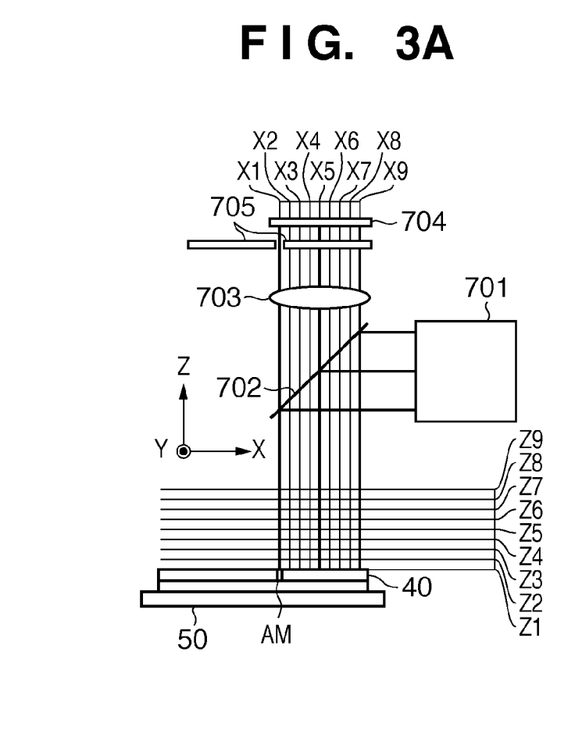
FIGS. 3A to 3C are views for explaining driving of a wafer stage and a light shielding plate in the wafer alignment in the exposure apparatus shown in FIG. 1.

In step S206, the wafer stage 50 (the wafer 40 held by it) and the light shielding plate 705 are driven to the initial positions. More specifically, as shown in FIG. 3A, the light shielding plate 705 and wafer stage 50 are driven so that the aperture in the light shielding plate 705 and the alignment mark AM are positioned in correspondence with an initial position (coordinate) X1 of the sensor 704 in the X-axis direction. Note that the light shielding plate 705 has an aperture with a size equal to or larger than the observation field of view in fine alignment, so the alignment mark AM can be precisely positioned at the initial position X1. Also, the wafer stage 50 is driven so that the alignment mark AM (the surface of the wafer 40) is positioned at an initial position (coordinate) Z1 in the Z-axis direction.

Figure 3B:
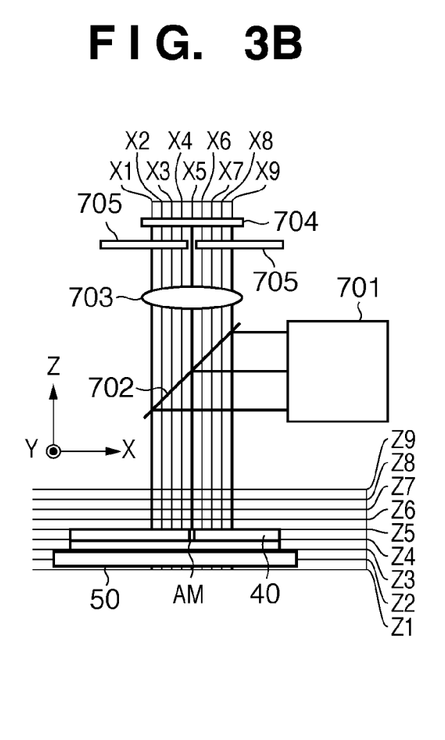
Figure 3C:
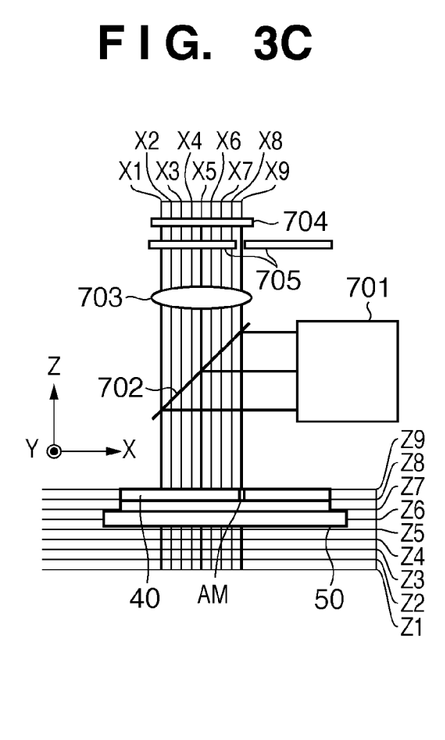

In step S208, illumination of the alignment mark AM with light from the illumination light source 701 starts. In step S210, storage of charges corresponding to light beams guided from the alignment mark AM to the plurality of regions, respectively, on the sensor 704 starts. In step S212, driving of the wafer stage 50 in the X- and Z-axis directions starts. More specifically, the wafer stage 50 is driven at a constant velocity in the X-axis direction so that the alignment mark AM formed on the wafer 40 is positioned from the initial position X1 through a final position X9. At the same time, the wafer stage 50 is driven at a constant velocity in the Z-axis direction so that the alignment mark AM formed on the wafer 40 is positioned from the initial position Z1 through a final position Z9. In step S214, driving of the light shielding plate 705 in the X-axis direction starts. More specifically, the light shielding plate 705 is driven at a constant velocity, so that the aperture in the light shielding plate 705 is positioned from the initial position X1 through the final position X9, in synchronism with the driving of the wafer stage 50 in the X-axis direction. Note that steps S208 to S214 are simultaneously executed with no time lag between them in practice. That is, in steps S208 to S214, the light shielding plate 705 and wafer stage 50 are driven, so the light guided from the alignment mark AM to the sensor 704 sequentially enters the plurality of regions on the sensor 704 while moving in the X-axis direction, as shown in FIGS. 3A to 3C.

In step S216, it is determined whether the alignment mark AM formed on the wafer 40 has reached the final positions (that is, the final position X9 in the X-axis direction, and the final position Z9 in the Z-axis direction). If the alignment mark AM has not yet reached the final positions, the determination in step S216 is repeated. In contrast, if the alignment mark AM has reached the final positions, the process advances to step S218.

In step S218, the illumination of the alignment mark AM with light from the illumination light source 701 ends. In step S220, the storage of charges corresponding to light beams guided from the alignment mark AM to the plurality of regions, respectively, on the sensor 704 ends. In step S222, the driving of the wafer stage 50 ends. In step S224, the driving of the light shielding plate 705 ends. Note that steps S218 to S224 are simultaneously executed with no time lag between them in practice.

In step S226, signals indicating the charges stored in the plurality of regions, respectively, on the sensor 704 are output to the processing unit 90. In this manner, charges are stored in the plurality of regions, respectively, on the sensor 704 in the duration in which the light from the alignment mark AM sequentially enters the plurality of regions on the sensor 704 while moving in the X-axis direction. Signals indicating the charges stored in the plurality of regions, respectively, are continuously output to the processing unit 90 after the light from the alignment mark AM sequentially enters the plurality of regions on the sensor 704 while moving in the X-axis direction. Note that the signals output from the sensor 704 are converted from analog signals to digital signals by the A/D converter 901, as described earlier, and stored in the memory 902 as a two-dimensional image in this embodiment.

Figure 4:
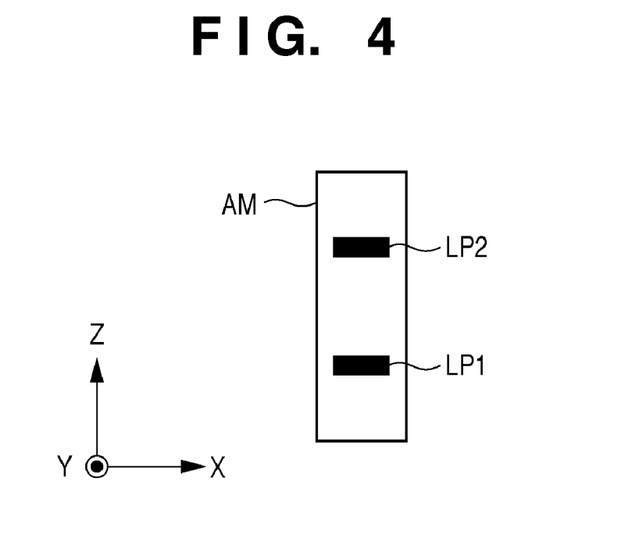
FIG. 4 is a view illustrating an example of an alignment mark formed on a wafer.
Figure 5:
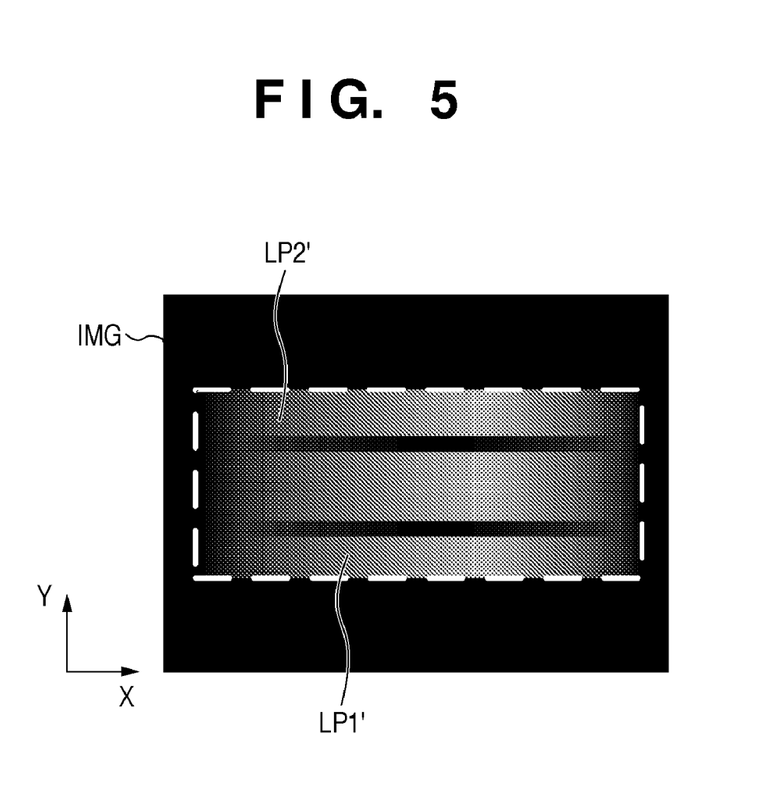
FIG. 5 is a view showing a two-dimensional image obtained upon sensing an image of the alignment mark shown in FIG. 4 by an alignment detection system of the exposure apparatus shown in FIG. 1.

The two-dimensional image stored in the memory 902 will be described herein. The alignment mark AM formed on the wafer 40 includes two line patterns LP1 and LP2 which align themselves in the Y-axis direction, as shown in FIG. 4. A two-dimensional image IMG as shown in FIG. 5 can be obtained by sensing an image of the alignment mark AM, shown in FIG. 4, using the alignment detection system 70. Because the alignment mark AM is driven in the X-axis direction, images LP1' and LP2' of the two line patterns LP1 and LP2, respectively, formed on the sensor 704 are sensed in shapes elongated in the X-axis direction, as shown in FIG. 5. Because the alignment mark AM is also driven in the Z-axis direction, the position in the X-axis direction in the two-dimensional image IMG corresponds to the position of the wafer stage 50 in the Z-axis direction. Although the alignment mark AM includes the two line patterns LP1 and LP2 in this embodiment, the number of line patterns which constitute the alignment mark AM is not limited to a specific number.

Referring back to FIG. 2B, in step S228, the CPU 903 of the processing unit 90 processes the two-dimensional image stored in the memory 902, and determines (calculates) a position (best focus position) of the wafer 40 in the height direction, which allows a best focus condition. More specifically, a position in the X-axis direction, which exhibits a peak in a light intensity distribution in the X-axis direction generated by the two-dimensional image IMG (that is, the signals from the sensor 704) shown in FIG. 5, is determined as a best focus position.

In step S230, the light shielding plate 705 is retracted outside the observation field of view of the alignment detection system 70. In step S232, the wafer stage 50 is driven to position the wafer 40 at the best focus position determined in step S228. In step S242, fine alignment is performed by observing (detecting) the alignment mark AM, formed on the wafer 40, using the alignment detection system 70, and the wafer alignment ends.

In this manner, in this embodiment, signals indicating the charges stored in the plurality of regions, respectively, on the sensor 704 are output continuously (that is, only once). Also, the signals contain information corresponding to the light intensity distributions at respective Z positions (the initial position Z1 to final position Z9 in this embodiment) of the wafer 40. Hence, the exposure apparatus 1 can align the wafer 40 (perform wafer alignment) in a short period of time.

Figure 6:
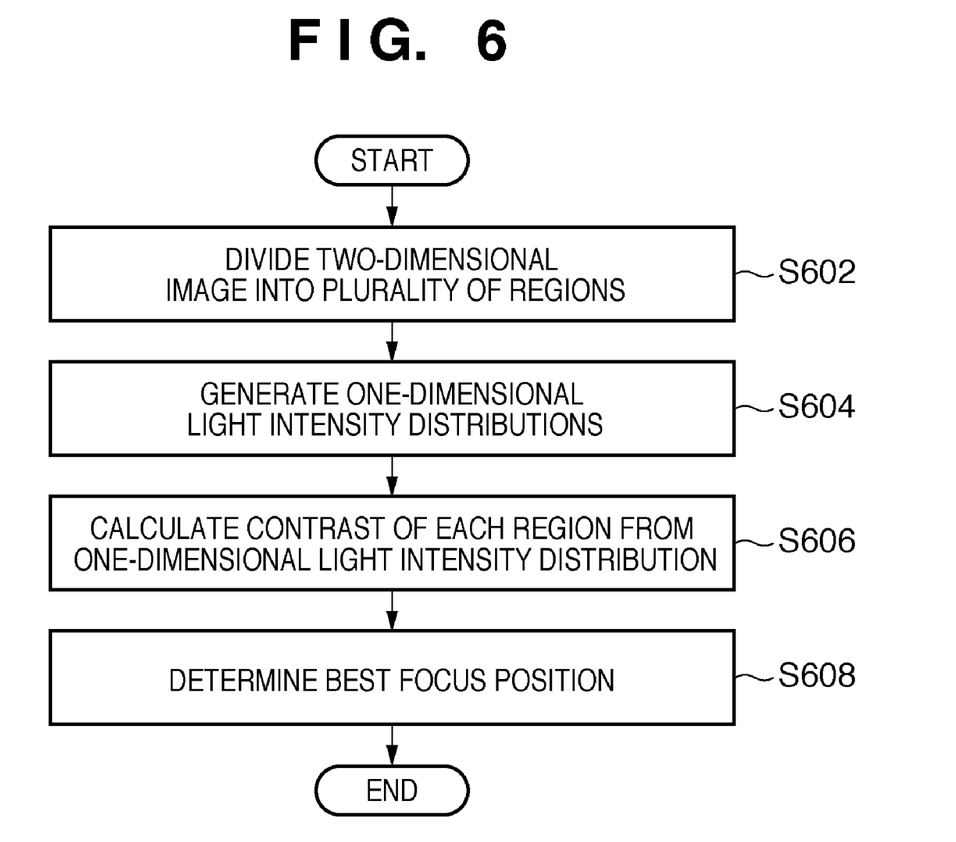
FIG. 6 is a flowchart for explaining an example of best focus position determination in step S228 of FIG. 2B.
Figure 7A:
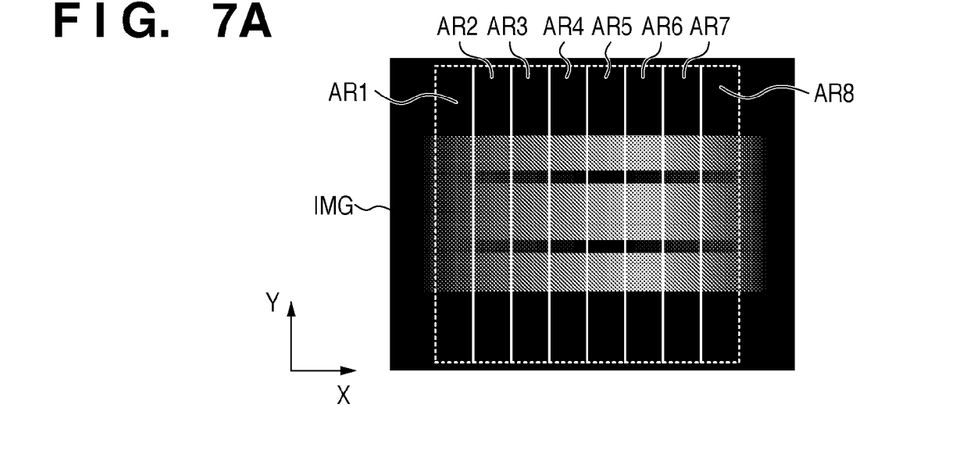
FIGS. 7A to 7C are views for explaining the best focus position determination shown in FIG. 6.
Figure 7B:
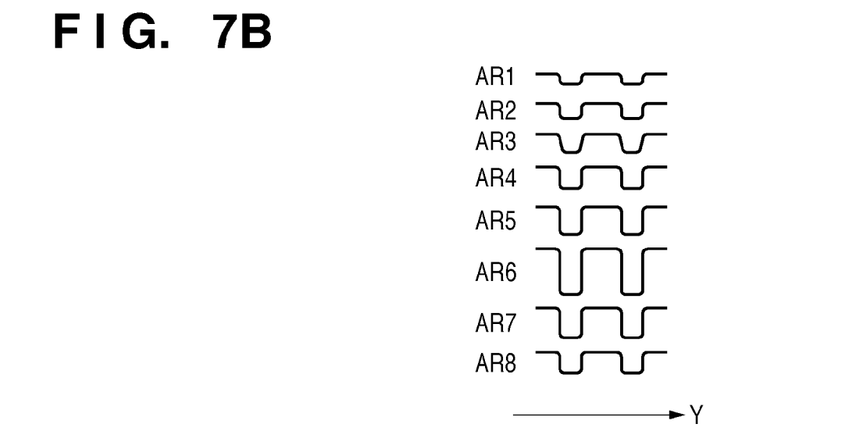
Figure 7C:
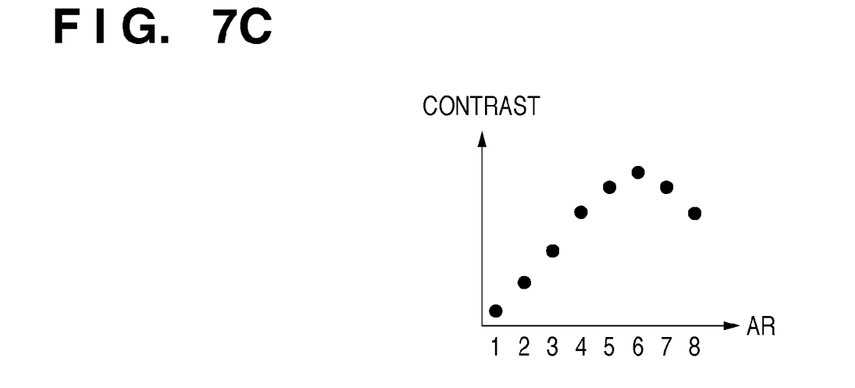

The best focus position determination in step S228 may be performed in accordance with a flowchart shown in FIG. 6. In step S602, a two-dimensional image stored in the memory 902 is divided into a plurality of regions. In this embodiment, as shown in FIG. 7A, the two-dimensional image IMG is divided into eight regions AR1 to AR8 such that they have the same area. In step S604, images (signals) in the regions AR1 to AR8 are integrated in the X-axis direction within each region to generate one-dimensional light intensity distributions (one-dimensional images) in the Y-axis direction (third direction), as shown in FIG. 7B. In step S606, the contrasts of the regions AR1 to AR8 are calculated from the one-dimensional light intensity distributions generated in step S604. In step S608, as shown in FIG. 7C, the contrasts of the regions AR1 to AR8 calculated in step S606 are compared to determine (calculate) the position (best focus position) of the wafer 40 in the height direction, which corresponds to a one-dimensional light intensity distribution with maximum contrast.

The best focus position determination shown in FIG. 6 is effective when an image with sufficient contrast cannot be obtained at each Z position of the wafer 40, and the obtained two-dimensional image, in turn, has low contrast. This is because when the two-dimensional image has low contrast, an erroneous best focus position may be determined (calculated) due to disturbance factors such as vibration of the wafer stage 50 or a variation in driving velocity.

In exposure, light emitted by the light source illuminates the reticle 20 by the illumination optical system 10. The light which bears the information of the pattern of the reticle 20 forms an image on the wafer 40 by the projection optical system 30. At this time, the exposure apparatus 1 aligns the wafer 40 in a short period of time, as described above. Hence, the exposure apparatus 1 can provide high-quality devices (for example, a semiconductor device, an LCD device, an image sensing device (for example, a CCD), and a thin film magnetic head) with a high throughput and good economical efficiency. These devices are fabricated by a step of exposing a substrate (for example, a wafer or a glass plate) coated with a photoresist (photosensitive agent) using the exposure apparatus 1, a step of developing the exposed substrate, and subsequent known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-197236 filed on Aug. 27, 2009, which is hereby incorporated by reference herein in its entirety.

What is claimed is:

1. A position detection apparatus comprising:
a sensor in which a plurality of regions where light from a mark formed on a substrate held by a stage is detected are arrayed in a first direction;
a first driving unit configured to drive the stage;
a control unit configured to control said first driving unit; and
a processing unit configured to process the signals from said sensor,
wherein said first driving unit drives the stage so that the mark is moved in a second direction perpendicular to a height direction of the substrate and a region which the light from the mark enters among the plurality of the regions moves in the first direction,
wherein said first driving unit drives the stage so that the mark is moved in the height direction of the substrate while the mark is being moved in the second direction, and
wherein said processing unit determines a position of the substrate in the height direction based on a light intensity distribution in the first direction which is measured by the plurality of regions of the sensor while the mark is being moved in the height direction and in the second direction.

2. The apparatus according to claim 1, further comprising:
a light shielding plate which is arranged between the substrate and said sensor, and has an aperture configured to guide the light from the mark to some of the plurality of regions; and
a second driving unit configured to drive said light shielding plate,
wherein said control unit controls said second driving unit so as to drive said light shielding plate in synchronism with the driving of the stage in the second direction.

3. The apparatus according to claim 1, wherein said sensor stores charges corresponding to light beams guided to the plurality of regions, respectively, in a duration in which the light from the mark enters the plurality of regions while moving in the first direction, and continuously outputs signals from the plurality of regions to said processing unit after the light from the mark enters the plurality of regions while moving in the first direction.

4. The apparatus according to claim 1, wherein
each of the plurality of regions includes pixels two-dimensionally arrayed in the first direction and a third direction perpendicular to the first direction, and
said processing unit integrates signals in respective regions in the first direction within each region to generate a plurality of one-dimensional light intensity distributions in the third direction, and determines a position of the substrate in the height direction, which corresponds to a one-dimensional light intensity distribution with maximum contrast, among the plurality of one-dimensional light intensity distributions generated for the plurality of regions, respectively.

5. An exposure apparatus comprising:
a projection optical system configured to project a pattern of a reticle onto a substrate held by a stage;
a sensor in which a plurality of regions where light from a mark formed on the substrate is detected are arrayed in a first direction;
a driving unit configured to drive the stage;
a control unit configured to control said driving unit; and
a processing unit configured to process the signals from said sensor,
wherein said driving unit drives the stage so that the mark is moved in a second direction perpendicular to a height direction of the substrate and a region which the light from the mark enters among the plurality of the regions moves in the first direction,
wherein said driving unit drives the stage so that the mark is moved in the height direction of the substrate while the mark is being moved in the second direction, and
wherein said processing unit determines a position of the substrate in the height direction based on a light intensity distribution in the first direction which is measured by the plurality of regions of the sensor while the mark is being moved in the height direction and in the second direction, and
said control unit controls said driving unit so as to position the substrate at the position of the substrate in the height direction determined by said processing unit.

6. A device fabrication method comprising steps of:
exposing a substrate using an exposure apparatus; and
performing a development process for the substrate exposed,
wherein the exposure apparatus includes:
a projection optical system configured to project a pattern of a reticle onto the substrate held by a stage;
a sensor in which a plurality of regions where light from a mark formed on the substrate is detected are arrayed in a first direction;
a driving unit configured to drive the stage;
a control unit configured to control said driving unit; and
a processing unit configured to process the signals from said sensor, wherein said driving unit drives the stage so that the mark is moved in a second direction perpendicular to a height direction of the substrate and a region which the light from the mark enters among the plurality of the regions moves in the first direction, wherein said driving unit drives the stage so that the mark is moved in the height direction of the substrate while the mark is being moved in the second direction, and wherein said processing unit determines a position of the substrate in the height direction based on a light intensity distribution in the first direction which is measured by the plurality of regions of the sensor while the mark is being moved in the height direction and in the second direction, and said control unit controls said driving unit so as to position the substrate at the position of the substrate in the height direction determined by said processing unit.

* * * * *